United States Patent
Sonnevi

(10) Patent No.: US 9,414,283 B2
(45) Date of Patent: Aug. 9, 2016

(54) METHOD AND APPARATUS FOR CONTROLLING TRANSFER OF NETWORK TRAFFIC

(75) Inventor: Fredrik Sonnevi, Hägersten (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/385,335

(22) PCT Filed: Mar. 30, 2012

(86) PCT No.: PCT/SE2012/050357
§ 371 (c)(1),
(2), (4) Date: Sep. 15, 2014

(87) PCT Pub. No.: WO2013/147660
PCT Pub. Date: Oct. 3, 2013

(65) Prior Publication Data
US 2015/0045030 A1    Feb. 12, 2015

(51) Int. Cl.
*H04W 36/22* (2009.01)
*H04W 36/30* (2009.01)
(Continued)

(52) U.S. Cl.
CPC ............ *H04W 36/22* (2013.01); *H04L 47/125* (2013.01); *H04W 24/02* (2013.01);
(Continued)

(58) Field of Classification Search
CPC ..... H04W 36/22; H04W 24/02; H04W 36/30; H04W 28/0247; H04W 28/08; H04W 28/06; H04L 47/125
USPC ...................................................... 455/436
See application file for complete search history.

(56) References Cited

U.S. PATENT DOCUMENTS

2007/0177510 A1   8/2007   Natarajan et al.
2009/0264123 A1   10/2009  Agashe et al.
(Continued)

FOREIGN PATENT DOCUMENTS

| | | |
|---|---|---|
| EP | 2 398 293 | 12/2011 |
| GB | 2 454 872 | 5/2009 |
| WO | WO 2011/105941 | 9/2011 |

OTHER PUBLICATIONS

PCT Written Opinion of the International Searching Authority for International application No. PCT/SE2012/050357, Mar. 6, 2013.
(Continued)

*Primary Examiner* — Leon Flores
(74) *Attorney, Agent, or Firm* — Baker Botts, LLP

(57) ABSTRACT

A method for controlling transfer of network traffic of network resources (12a, b, c, d, e) comprising a first radio base station (12a) having a first transport link (18a), and a second radio base station (12b) having a second transport link (16b), of a wireless communications system (10), the method comprising: —performing (22) radio access network, RAN, handling, wherein the RAN handling comprises: —analyzing (23) transport link characteristics of the transport links (16a, 16b); —selecting (24) transport Sink (16a, 16b) based on the analysis of the characteristics of the transport links (16a, 16b) available for network traffic using a network resource controller (19) configured to control the network resources (12a, b, c, d, e). There is also provided an apparatus (18) for performing the method. In this way there is provided a method and apparatus for controlling transfer of network traffic taking the different and varying transport characteristics of individual transport links of different radio base stations and radio access technologies into account.

13 Claims, 3 Drawing Sheets

(51) Int. Cl.
  *H04W 28/02* (2009.01)
  *H04W 28/08* (2009.01)
  *H04L 12/803* (2013.01)
  *H04W 24/02* (2009.01)
  *H04W 92/12* (2009.01)
  *H04W 28/06* (2009.01)
  *H04W 72/02* (2009.01)
  *H04W 88/06* (2009.01)

(52) U.S. Cl.
  CPC ......... *H04W 28/0247* (2013.01); *H04W 28/08* (2013.01); *H04W 36/30* (2013.01); *H04W 28/06* (2013.01); *H04W 72/02* (2013.01); *H04W 88/06* (2013.01); *H04W 92/12* (2013.01)

(56) References Cited

U.S. PATENT DOCUMENTS

2010/0255836 A1* 10/2010 Chen .......................... 455/426.1
2013/0102313 A1*  4/2013 Tinnakornsrisuphap
                            et al. ............................ 455/436
2013/0235726 A1*  9/2013 Frederiksen et al. ......... 370/235

OTHER PUBLICATIONS

PCT International Search Report for International application No. PCT/2012/050357, Mar. 6, 2013.
"A Functional End-to-End QoS Architecture Enabling Radio and IP Transport Coordination" by Olmos et al., 2007.

* cited by examiner

METHOD AND APPARATUS FOR CONTROLLING TRANSFER OF NETWORK TRAFFIC

PRIORITY

This nonprovisional application is a U.S. National Stage Filing under 35 U.S.C. §371 of International Patent Application Serial No. PCT/SE2012/050357, filed Mar. 30, 2012 and entitled "A Method and Apparatus for Controlling Transfer of Network Traffic."

TECHNICAL FIELD

The embodiments described herein relate to a method and an apparatus of a wireless communications system for controlling transfer of network traffic.

BACKGROUND

Radio interface problems related to transfer of network traffic in the Radio Access Network (RAN) have been dealt with quite a lot in wireless communications systems. Traditionally, a bottleneck for transfer of network traffic has been present in the radio interface at a radio base station of the RAN since it has been the most expensive network resource compared to other network resources such as the transport network of the RAN.

But, as the radio interface has evolved, for instance in terms of throughput of traffic, quality of traffic, round trip time of traffic etc., the transport network has instead become the new bottleneck for transfer of network traffic in the RAN.

With the introduction of higher peak rates and smaller radio base stations such as radio base stations covering increasingly smaller cells typically including so-called "pico" and "femto" cells, the cost of the transport network has now increased beyond the cost of the radio interface, at least in some applications, for instance due to the increased number of radio base stations required for the increased number of cells. A higher number of small cells are required to cover the same area as fewer larger cells: hence the number of radio base stations increases.

The current solutions do not solve the problem with the transport network sometimes being the bottleneck for the transfer of network traffic.

SUMMARY

It is an object to provide a method and an apparatus for controlling network resources, which obviate at least some of the above mentioned drawbacks.

The above stated object is achieved by means of method and apparatus according to the independent claims and by the embodiments according to the dependent claims.

A first embodiment provides a method for controlling transfer of network traffic of network resources comprising a first radio base station having a first transport link, and a second radio base station having a second transport link, of a wireless communications system. Radio Access Network (RAN) handling, RAN handling is performed, wherein the RAN handling comprises analyzing transport link characteristics of the transport links; selecting transport link based on the analysis of the characteristics of the transport links available for network traffic using a network resource controller configured to control the network resources.

A second embodiment provides an apparatus for controlling transfer of network traffic of network resources comprising a first radio base station having a first transport link, and a second radio base station having a second transport link, of a wireless communications system. The apparatus is configured to perform RAN handling, wherein the RAN handling comprises to analyze transport link characteristics of the transport links; and to select transport link based on the analysis of the characteristics of the transport links available for network traffic.

An advantage of certain embodiments described herein is that they take varying transport links characteristics into account when performing RAN handling, in contrast to current 3GPP/IEEE solutions and standards which assume that all transport links to the radio base stations have similar characteristics regardless of which type of radio base station or Radio Access Technology (RAT) is employed. This is however not corresponding to the reality, since in reality there is a broad variety of transports links having different characteristics connecting the radio base stations, also within the same RAT. Examples of RAT:s may for example be: Global System for Mobile communications (GSM), Wideband Code Division Multiple Access (WCDMA), CDMA2000, Long Term Evolution (LTE) and Wireless LAN (Win).

A particular advantage of certain embodiments described herein is that they provide optimal end user experience for instance for gaming, smart phone applications and voice, all based on information from transport link characteristics. Examples of optimized end user experience will be described in more detail as follows, but increased throughput and less dropped calls are typical examples.

According to an aspect, this is a new concept of combining knowledge of transport link characteristics with the RAN handling for controlling transfer of network traffic by means of selecting a particular suitable transport link, which concept, according to our best knowledge, has not been used before. The current RAN handling does not take transport link characteristics into account for selecting network resources, in particular transport link.

Herein, the term "RAN handling" comprises all types of RAN service selection mechanisms, including, but not limited to Radio Access Bearer (RAB) handling, RAB handling can be described as handling, for instance setting up, a transport link.

Herein, the term "transport link characteristics" include at least one or more of the following aspects: traffic load, throughput, round trip time, packet loss etc. They will be described in more detail as follows with regard to various embodiments that will be described.

Another advantage of certain embodiments described herein is that they utilize the radio access network resources efficiently since the transport link characteristics are taken into account when performing RAN handling. A particular suitable transport link of a particular suitable radio base station and radio access technology can be used for a particular requested service. In this way, the operator can utilize RAN resources more efficiently. This means also that the operator will see improvements without investing in more resources system resources such as more transport capacity and radio spectrum by adding more RBS:s for instance. The solution provided by certain embodiments is hence also very cost effective.

Herein, the term "efficiently" means that system resources available are used more efficiently than the usage of prior art resources not taking transport link characteristics into account.

In this disclosure throughout, conventional terms and their abbreviations that have been considered to be well-known to the skilled person have been used as much as possible for a better understanding. A list of abbreviations is also included on the last page of the description. Since they are considered to be well-known to the skilled person they are used without exhaustive definitions. Thus, only terms considered to require a more exhaustive explanation have been explained in more detail, often by means of concrete examples to assist understanding.

Further advantages and features of embodiments of the present disclosure will become apparent when reading the following detailed description in conjunction with the drawings.

DETAILED DESCRIPTION

The present invention will now be described more fully hereinafter with reference to the accompanying drawings, in which different exemplary embodiments are shown. These exemplary embodiments are provided so that this disclosure will be thorough and complete and not for purposes of limitation.

Figure 1:
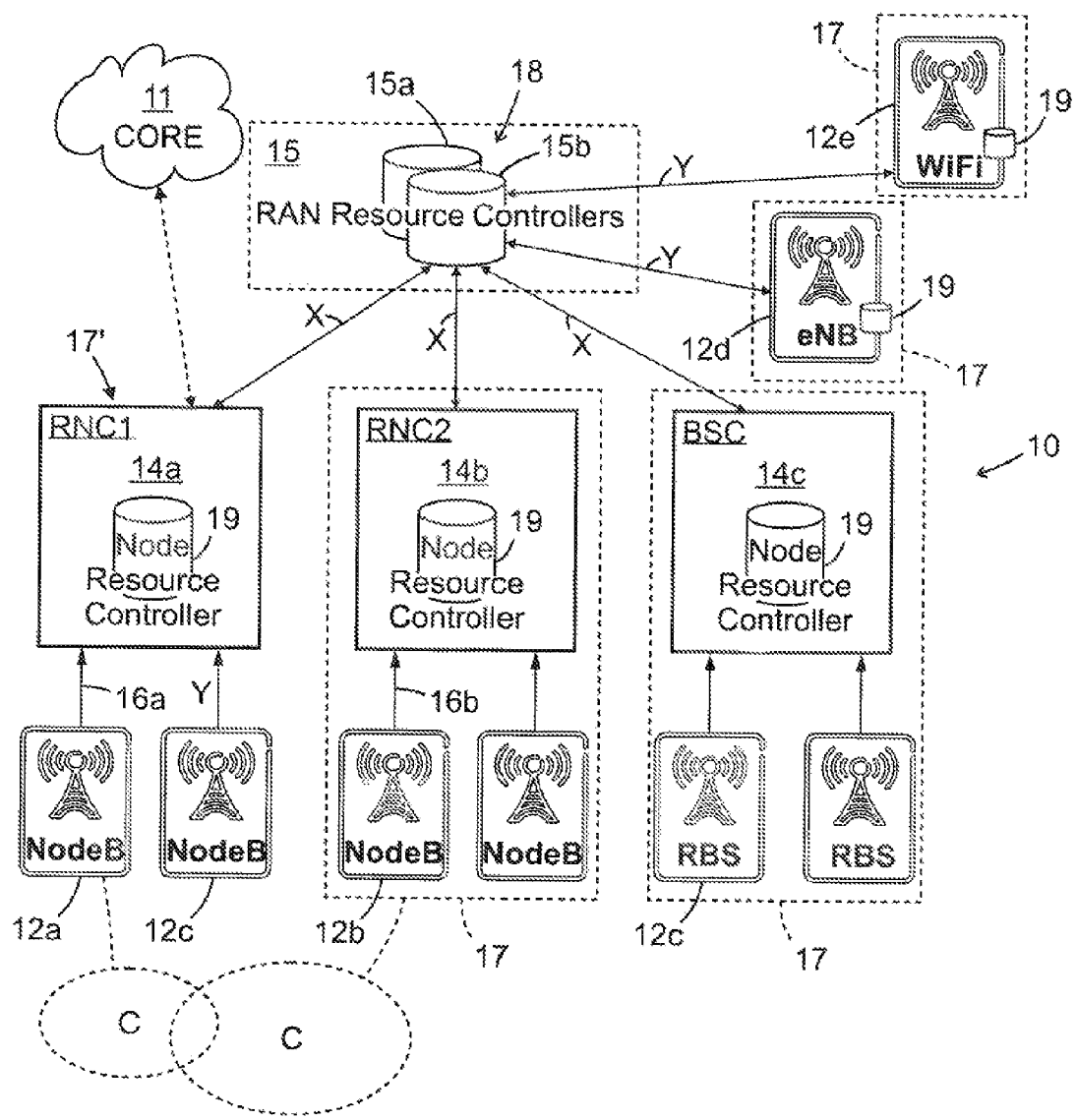
FIG. 1 is a schematic block diagram of a wireless communication system in which an embodiment of this disclosure is implemented.

FIG. 1 illustrates an example of a wireless communications system 10 comprising different RAT:s 17 having different base station nodes 12a, b, c, d, e, in which wireless communications system 10 embodiments of this disclosure may be implemented. The exemplary RAT:s 17 can include GSM, WCDMA, CDMA2000, LTE networks, and WiFi networks, or any combination thereof. For the sake of simplicity, only those parts of the wireless communications system 10 that are of particular relevance to the embodiments discussed herein are illustrated. Moreover, only parts of the RAN relevant to the understanding of the disclosure are illustrated and other parts of the wireless communication system 10 are not illustrated or only schematically illustrated. In this figure, connection to a core network 11 is only schematically illustrated by a dashed line, since the core network 11 is not considered in this disclosure, but only the RAN.

The wireless communications system 10 illustrated in FIG. 1 includes a first radio base station 12a for WCDMA, denoted "NodeB", a second radio base station 12b for WCDMA denoted "NodeB", a third radio base station 12c for GSM, denoted "RBS", a fourth radio base station 12d for LTE, denoted "eNB" and a fifth radio base station 12e for a wireless LAN (Local area Network), denoted "WiFi".

The first and second radio base stations 12a, 12b are connected to a respective distributed network node, 14a, 14b herein comprising a Radio Network controller (RNC). Each RNC, denoted RNC1, and RNC2, respectively comprises or is configured to communicate with a node resource controller 19 and is connected to the respective radio base station via a first 16a and a second 16b transport link, respectively. The third radio base station 12c is connected to a distributed network node 14c, herein comprising a Base Station Controller (BSC) comprising or configured to communicate with a node resource controller 19. The distributed network nodes 14a, b, c are connected to or configured to communicate with a first network node 15 comprising duplicated RAN resource controllers 16a, 15b via a respective interface X applicable to RAT:s 17 using an RNC, i.e. to WCDMA and GSM. The communication between the distributed nodes 14a, b, c and the RAN resource controllers 15a, 15b is illustrated by means of double-headed arrows to indicate both single and/or multi-way communication. The node resource controller(s) 19 can be embodied as one or more local data base(s) controlled by suitable processing circuitry (not illustrated) for instance provided by the RNC, in which local measurement and configuration data for RAN handling including analysis of transport link characteristics and selection of transport link 16a, 16b can be used for instance in order to perform optimized network service handling for a radio network service. Examples of such optimized network service handling and network services will be given as follows. Also the RAN resource controllers 15a, 15b can be embodied as one or more data base(s) controlled by suitable processing circuitry in which measurement and configuration data for RAN handling including analysis of transport link characteristics and selection of transport link 16a, 16b can be contained. The RAN resource controllers 15a, 15b and the node resource controllers 19 may altogether, or separately, provide an apparatus 18 for controlling transfer of network traffic of the network resources 12a, b, c, d, e. The apparatus 18 may be embodied as a resource controller.

As illustrated in FIG. 1, according to an embodiment, the functional architecture for providing analysis of transport link characteristics and selection of transport link 16a, 16b, i.e. the functionality of the apparatus 18 can be considered to be divided into a central RAN resource controller 15a and any number of distributed node resource controllers 19 including these located in the base stations 12d, 12e. Typically, configuration and characteristics data is automatically synchronized between central and distributed controllers, such as RAN resource 15a, 15b and node resource controllers 19. According to alternative embodiments, the functional architecture of the apparatus 18 can be provided in any other suitable way, for instance such that the RAN resource controllers 16a, 15b (illustrated schematically in FIG. 1), or node resource controllers 19 have all, or a large part of the functionality.

The number of radio base stations linked to a particular distributed node 14a can be any number, although two are illustrated in FIG. 1. There can be more transport links 16a, 16b than illustrated and described. As illustrated in FIG. 1, each distributed network node 14a, 14b, 14c is connected to two base stations via the transport link 16a, 16b, respectively. The communication between a distributed network node 14a and a radio base station 12a is typically by wire, but also wireless communication e.g. using radio link is of course possible.

The fourth 12d and fifth 12e radio base stations, each comprising a node resource controller 19, are connected to, or configured to communicate with, the first node 15 comprising the RAN resource controllers 15a, 15b via a respective interface Y applicable to RAT:s 17 not using a radio network (RNC) or base station (BSC) controller, i.e. to LTE and WiFi networks for instance. The RAN resource controllers 15a, 15b can be duplicated, as illustrated in FIG. 1, to provide redundancy. However, a single RAN resource controller 15a is of course possible.

According to venous embodiments, a gateway node, router or switch may comprise the RAN resource controller(s) 15a, 15b.

The radio base stations 12a, b, c, d, e including transport links 16a, 16b and the network nodes 14a, b, c and other equipment can be considered to provide network resources without any limitations to all of these mentioned combined. Thus, network resources 12a, b, c, d, e may include only one or two of these.

The status, including the characteristics of the transport link 16a, 16b of which only the first and the second transport link 16a, 16b are illustrated because of simplicity can be monitored by the node resource controllers 19. This is exemplified by means of the direction (uplink) of the transport links 16a, 16b.

In the embodiments described above, typically the radio base stations 12d, 12e comprise software to be able to provide or operate the node resource controllers 19. According to an embodiment, each node resource controller 19 can contain or be arranged to communicate with control circuitry (not illustrated) for controlling the node resource controller 19. The control circuitry (not illustrated) may comprise one or more programmable processors programmed to perform the steps according to FIG. 2 or FIG. 3. However, any data processing circuitry or combination of different types of processor(s) and memory that are capable of performing this can be employed.

Examples of the transport link characteristics that can be monitored are: available bandwidth, transport link load, link availability, throughput, and quality, round trip time (RTT), delay, delay variation and packet loss. These transport link characteristics, of which all per se are considered to be known to the skilled person, will be described in more detail as follows by means of concrete examples of operation.

According to an aspect of the disclosure, in order to provide an optimal end-user experience and provide an operator to be able to utilize the network resources efficiently, the transport link characteristics are taken into account when performing RAN handling.

Depending on service, for instance end-user service, the apparatus 10 can trigger a cell change, normally referred to as "handover", within an RAT IT or even perform an inter system handover to a different RAT 17" depending on analyzed transport link characteristics such as link capacity or RTT if the analysis indicates that another transport link 16b and RAT 17" is better according to any parameter such as better link capacity, for instance to provide more traffic load. Another parameter can indicate that more throughput is possible, for instance because of more bandwidth available. Quality can be increased, for instance to provide better quality of transmitted traffic data. RTT can be shorter so another transport link will be faster than another. Delay may be shorter so on-line gaming for instance will improve the end-user experience being able to for instance play an on-line game without delay.

According to an embodiment, the RAN resource controllers 16a, 15b and the node resource controllers 19 contain real-time transport link characteristics data. The transport link characteristics data in the resource controllers 15a, b and 19 is used in order to select, or trigger the optimal RAT 17 and radio base stations 12a, b, c, d, e in order to provide a good end-user service and utilize the system resources such as RAT 17, transport links 16a, b and radio base stations 12a, 12b, 12c, 12d, 12e efficiently.

In the following, examples of situations that may occur will be described for explaining the exemplary embodiments in operation.

Typically, there are three different exemplary procedures into which the different embodiments can be used, namely: "transport link monitoring", "Radio Access Bearer (RAB) establishment procedure" and "mobility procedure". For the most convenient understanding and definition each exemplary procedure will be explained in more detail as follows by means of concrete examples instead of being defined only.

Transport Link Monitoring:

According to an embodiment, the information is configured to be available more, or less in real-time as the characteristics of the transport links, for instance the first transport link 16a to the radio base station 12a varies rapidly. According to an embodiment, all transport link characteristics are based on the transport link from the distributed node 14a to the radio base station 12a. According to an embodiment, a state, or in other words, input measurements of transport link characteristics are monitored, typically updated each 30 seconds, which can be considered to be a high level in this context, in order to provide an accurate view of the transport link characteristics. According to an embodiment, as illustrated in FIG. 1, the link characteristics data is stored in the node resource controller(s) 19 of the distributed nodes 14a, 14b and 14c.

According to different embodiments, transport link monitoring is applicable to, meaning is included as part of, RAB establishment procedure, as well as part of, the mobility procedure.

Figure 2:
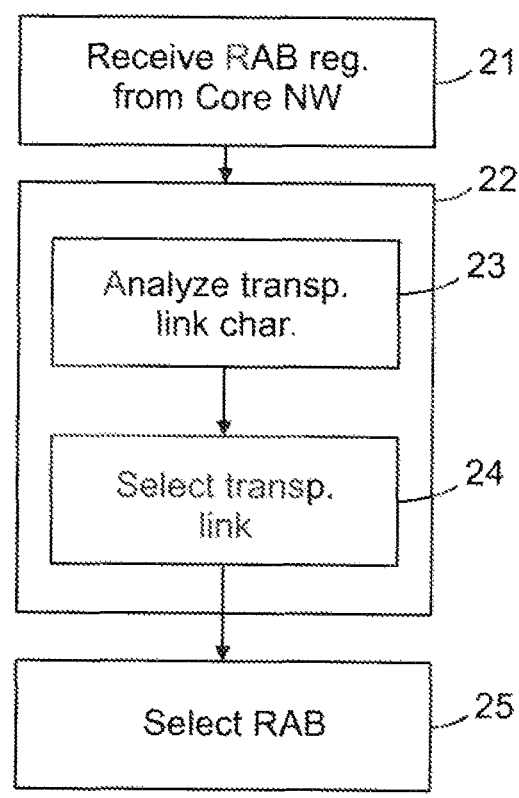
FIG. 2 is a flow diagram illustrating an embodiment of a method in a wireless communication system.

RAB Establishment Procedure:

In FIG. 2, a RAB establishment procedure, according to an embodiment, in a wireless communication network 10 as described in FIG. 1 is illustrated.

First, a RAB establishment request is received 21 from the core network 11 to a default RAT 17'. In this context, a default, or in other words anchoring, RAT 17' is considered to be any RAT that is per default responsible for receiving and transmitting information from the core network 11. A distributed network node 14a comprising a node resource controller 19 is requested to identify 23 the best RAT 17 to be used for the RAB establishment request, wherein the best RAT 17 means which RAT 17 is most suitable to comply with end-user requirements. Then, the RAN resource controllers 15a, 15b, perform RAN handling 22, and analyses, or identifies 23 which RAT 17 will provide the best end-user experience. The analysis or identification is based on information from the transport link 16a, 16b monitoring and possibly also cell c, C and carrier configuration. This RAT 17" is called a "target RAT" 17". In this context, cell c, C means a radio coverage area of a radio base station 12a, wherein the former may symbolize a smaller cell c, having a smaller radio coverage area than the latter cell C.

Though, herein, reference is made to only a first 16a and a second 16b transport link, because of simplicity, the number of transport links 16a, b monitored and analyzed can be any number and the location of the transport links 16a, 16b can be in any RAT 17.

Then, transport link is selected 24, based on the analysis of the characteristics of the transport links 16a, 16b available for network traffic. This can be provided in that the default RAT 17' forwards the RAG establishment request to the target RAT 17". The target RAT 17" selects radio base station 12b based on which cell and carrier of the radio base stations 12a, 12b available can provide the best end-user experience based on its information such as transport link characteristics. The local node resource controller(s) 19, typically having more accurate information than the central RAN resource controller(s) 15a, 15b can be employed to select or assist analysis and selection.

In this way, the RAG establishment procedure can identify the RAT 17, radio base stations 12a, b, c, d, e and in some applications even cell C and carrier (not illustrated), which will provide the optimal end-user experience for a particular service to satisfy the user.

Typically, a requested RAN service depends on, i.e. which end-user service will be used. Different end-user services demands different network resources and transport links having different transport link characteristics. This will be further explained as follows by some typically examples and their advantages.

Examples of RAN service input parameters are RAG type, Scheduling Priority Indicator (SPI), Allocation and Retention Priority (ARP), Traffic Handling Priority (THP). Signalling Indicator (SI), End user service using deep packet inspection (DPI), all of which are considered to be well-known to the skilled person. The target radio base station 12b, of the target RAT 17", configuration for identifying the optimal radio base station, cell, c, C, and possibly even information about which carrier is optimal, or in other words most suitable to execute the end-user service can be used as decision parameters. Herein, optimal typically means which service will assist the end-user best, for instance which provide a fast data transfer such that an online game can be played fast enough to satisfy the end-user thereby providing an optimal end-user experience, of course optimal based on the network resources available for that particular user and to at least some extent depending also on network operator requirements. For instance, the network operator may not be willing to invest in to expensive network resources.

Radio base station, cell and carrier configuration input parameters can be of different types. One parameter can be type of radio base station, since the radio base station can be of for instance macro, micro, pico, femto cell type. As an example, for instance the radio base station having the smallest cell c can be selected to assist traffic load spread over many radio base stations. Other parameters can be Number of Quality of Service (QoS) classes, or number of carriers, wherein the number of carriers is related to the number of transport carriers of a particular radio base station.

Then, RAB is established 25 to the target RBS 17", cell C and carrier as currently standardized by 3GPP and IEEE.

Typically, if there are no transport link characteristics available, then the RAB will be established without taking traffic link characteristics into account.

Figure 3:
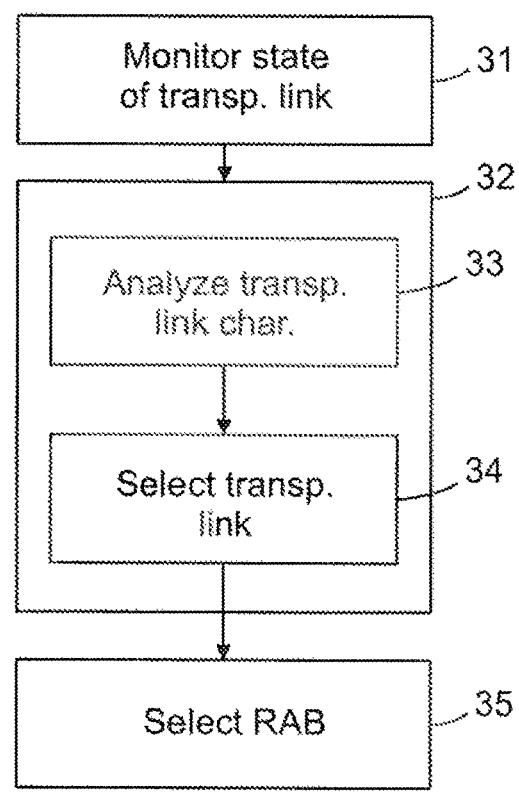
FIG. 3 is a flow diagram illustrating an embodiment of a method in a wireless communication system.

Now is referred to FIG. 3, which illustrates a flow diagram illustrating embodiments of a method in a network node for controlling of network traffic of a wireless communication system. This flow diagram illustrates mobility, or in other words hand-over, procedures. The meaning of mobility will be described with some concrete examples of hand-over procedures.

Load Based Handover:

According to an embodiment, load based handover is provided as continuously, or alternatively, periodically with an interval, monitoring 31 the state of the transport links 16a, b in order to identify, the optimal RAT, radio base station, cell, and carrier to provide the best end user service that provides the highest possible bit rate of the transport links 16a, b available.

According to an embodiment, a load based handover evaluation 32 is triggered within the default RAT 17' by its corresponding node resource controller 19'. Alternatively, the load based handover evaluation can be triggered within the target RAT 17". The node resource controller 19" of the target RAT 17" controls if there is another radio base station, cell, and carrier within the target 19' or default node resource controller 19' that can provide a better service. The node resource controller 19 identifies the best RAT 17 to be used for the RAB request. The central RAN controller 15a, 15b analyses 23, typically identities which RAT 17 can provide the best end-user experience based on its information from the monitoring 31 of the transport link characteristics and cell c. C and/or carrier configuration. Based on the received information the default RAT 17' selects 34, 35, transport link and RAB to perform an inter-system handover to a different RAT, such as the target RAT 17" or to continue with the same RAT, the default RAT 17', it's corresponding radio base station, cell c and carrier.

Coverage Based Handover:

Coverage Based Handover is from a procedure point of view similar to the "Load Based Handover" described above. The main difference is that the trigger for the handover is based on neighbor cell c, C relations radio coverage and as reported by user equipment (UE) (not illustrated) of the cell c, C. AS an example, a coverage based handover is triggered 32 within the default RAT 17'. The node resource controller 19' of the default RAT 17' checks 33, 34 which radio base station, cell and carrier within the node resource controller 19' that can provide the best service. The RAN Resource Controller(s) 15a, 15b identifies 23 the best RAT 17 to be used for the requested service. The central RAN Resource Controller(s) 15b identifies 23 which RAT 17 that can provide the best end user experience based on its information from the link characteristics monitoring and cell and/or carrier configuration as an example. AS an example, based on the received information the default RAT 17' makes a decision 24, 25 to perform an intra-system handover to a different radio base station 12b, cell C, and carrier, or continue with the same cell c and carrier.

An advantage with the mobility procedure according to the various embodiments described above is to identify the RAT, radio base station, cell, and possibly carrier that can provide the optimal end user experience based on the transport link characteristics. The advantages of the functionality is coverage, load and service based handover as described above. Existing solutions as standardized by 3GPP and IEEE do not take the transport link characteristics into account.

In the following examples of optimized end user services will be given by describing exemplary functions.

Throughput Optimisation:

The throughput can be optimized by tracking a so-called "line rate" which can be described as maximum possible capacity, and the currently available bandwidth. This information can be retrieved via bandwidth estimation methods, known per se, such as BART, TAMP etc.

The transport link can be selected based upon transport link characteristics such as available capacity and type of radio base station. According to an embodiment, small cells are selected first (i.e. use a femto layer (cell) before a macro (cell) in order to provide offload), low packet loss (e.g. <$10^{-6}$) in order to achieve high TCP peak rates and low round trip time (RTT) typically to be taken into account in order to achieve bitrates above say 50 Mbit/s.

Network Access Time Optimization:

The Network Access Time can be optimized in order to deliver a better end user experience or gaming, chatty smart phone applications, and voice end user experience According to an embodiment, the network access time, is optimized by monitoring the RTT of the radio base station. This information can be retrieved by well-known methods such as WCDMA node sync or TWAMP.

The transport link can be selected based upon: type of radio base station, such that large cell are selected first, e.g. macro cell layer is used in order to decrease the number of handovers, low RTT in order to improve voice experience and provide quick Internet access time and low packet loss.

According to various embodiments, the Call Completion Rate (CCR), Hand Over Success Rate (HOSR) and Call Setup Success Rate (CSR) can be improved by monitoring the availability of the connectivity. Since the control plane and the user planes can use different QoS classes it is important the monitor the connectivity for the individual QoS classes.

According to various embodiments, the connectivity can be monitored using well-known methods and protocols including a heartbeat protocol such as TWAMP, BFD, ICMP Ping or counting FP frames. This is a great advantage, since currently 3GPP standard does not specify any way of checking the user plane connectivity for IP transport.

The RTT difference between the radio links (in a handover case) can be used as an input in order to perform a successful soft handover. The radio link can be selected for instance based upon: availability and RTT.

According to various embodiments, the function described above including: throughput optimisation, network access time optimisation and call completion rate can be executed at the "RAS Establishment Procedure" as well as at "Mobility Procedures".

According to an embodiment, there is provided a computer program product comprising program code portions for performing the method steps when the computer program product is run on a computer. The program can also be stored on a computer-readable recording medium.

In the drawings and specification, there have been disclosed typical embodiments and, although specific terms are employed, they are used in a generic and descriptive sense only and not for purposes of limitation, the scope of the invention being set forth in the following claims.

LIST OF ABBREVIATIONS

ARP Allocation and Retention Priority
BART Bandwidth Available in Real-Time
BFD Bi-direction Forward Detection
BSC Base Station Controller
CAPEX Capital Expenditures
CCR Call Completion Rate
CSSR Call Setup Success Rate
DPI Deep Packet Inspection
FP Frame Protocol
GSM Global System f r Mobile Communications
HO Hand Over
HOSR HO Success Rate
ICMP Internet Control Message Protocol
KPI Key Performance Indicator
LTE Long Term Evolution
OPEX Operating Expenditures
QoS Quality of Service
RAB Radio Access Bearer
RAN Radio Access Network
RAT Radio Access Technology
RBS Radio Base Station
RF Radio Frequency
RNC Radio Network Cont
RTT Round Trip Time
SPI Scheduling Priority Indicator
TWAMP Two Way Active Measurement Protocol
THP Traffic Handling Priority
WCDMA Wideband Code Division Multiple Access
WiFi Wireless LAN

The invention claimed is:

1. A method for controlling transfer of network traffic of network resources comprising a first radio base station having a first transport link, and a second radio base station having a second transport link, of a wireless communications system, the method comprising:
 receiving a Radio Access Bearer, RAB, request from a core network to identify Radio Access technology, RAT, and radio base station for establishing a communication;
 performing radio access network, RAN, handling, wherein the RAN handling comprises:
 analyzing transport link characteristics of the transport links; and
 selecting transport link based on the analysis of the characteristics of the transport links available for network traffic using a network resource controller configured to control the network resources; and
 selecting RAT, radio base station and RAB based on transport link characteristics.

2. The method according to claim 1, wherein the RAN handling is at least partly performed in a first node.

3. The method according to claim 2, wherein the RAN handling is at least partly performed in a distributed network node configured to communicate with the first node and a core network.

4. The method according to claim 2, wherein the RAN handling is controlled using a Radio Access Network, RAN, resource controller.

5. The method according to claim 4, wherein the RAN handling is controlled in a plurality of RAN resource controllers.

6. The method according to claim 1 wherein the RAN handling comprises:
 monitoring a state of a transport link;
 triggering a handover from the first radio base station to the second radio base station depending on the state.

7. An apparatus in a node for controlling transfer of network traffic of network resources comprising a first radio base station having a first transport link, and a second radio base station having a second transport link, of a wireless communications system, the apparatus being configured to:
 receive a Radio Access Bearer, RAB, request from a core network to identify Radio Access technology, RAT, and radio base station for establishing a communication;
 perform radio access network, RAN, handling, wherein the RAN handling comprises:
 analyze transport link characteristics of the transport links; and
 select transport link based on the analysis of the characteristics of the transport links available for network traffic; and
 select RAT, radio base station and RAB based on transport link characteristics.

8. The apparatus according to claim 7, comprising a Radio Access Network, RAN, resource controller configured to communicate with a plurality of distributed network nodes comprising node resource controllers configured to control the RAN handling at least partly.

9. The apparatus according to claim 7, comprising a Radio Access Network, RAN, resource controller, wherein the RAN resource controller is configured to communicate with radio base stations comprising node resource controllers configured to control the RAN handling at least partly.

10. The apparatus according to claim 7, comprising a plurality of RAN resource controllers.

11. The apparatus according to claim 7, wherein the apparatus is configured to monitor a state of a transport link and trigger a handover from the first radio base station to the second radio base station depending on the state.

12. A gateway node comprising the apparatus according to claim 7.

13. A router or switch comprising the apparatus according to claim 7.

* * * * *